US010008999B2

(12) United States Patent
Morito et al.

(10) Patent No.: US 10,008,999 B2
(45) Date of Patent: Jun. 26, 2018

(54) CONTROL DEVICE FOR VARIABLE CAPACITANCE DEVICE AND COMMUNICATION DEVICE INCLUDING SAID CONTROL DEVICE

(71) Applicants: Taiyo Yuden Co., Ltd., Tokyo (JP); Dexerials Corporation, Tokyo (JP)

(72) Inventors: Kentaro Morito, Tokyo (JP); Masayoshi Kanno, Tokyo (JP)

(73) Assignees: TAIYO YUDEN CO., LTD., Tokyo (JP); DEXERIALS CORPORATION, Tokyo (JP)

( * ) Notice: Subject to any disclaimer, the term of this patent is extended or adjusted under 35 U.S.C. 154(b) by 58 days.

(21) Appl. No.: 15/180,417

(22) Filed: Jun. 13, 2016

(65) Prior Publication Data

US 2016/0294349 A1     Oct. 6, 2016

Related U.S. Application Data

(63) Continuation of application No. PCT/JP2015/050022, filed on Jan. 5, 2015.

(30) Foreign Application Priority Data

Jan. 7, 2014     (JP) ................................ 2014-001173

(51) Int. Cl.
*H03H 7/01*     (2006.01)
*H03H 7/06*     (2006.01)
(Continued)

(52) U.S. Cl.
CPC ............ *H03H 7/0153* (2013.01); *H03H 7/01* (2013.01); *H03H 7/0115* (2013.01); *H03H 7/06* (2013.01);
(Continued)

(58) Field of Classification Search
CPC ...... H03H 7/0153; H03H 7/01; H03H 7/0115; H03H 7/06; H03H 1/02; H03H 2210/025;
(Continued)

(56) References Cited

U.S. PATENT DOCUMENTS

| 8,634,772 | B2 | 1/2014 | Kanno | |
|---|---|---|---|---|
| 2012/0252391 | A1* | 10/2012 | Kanno | H01Q 1/243 |
| | | | | 455/230 |
| 2014/0227986 | A1 | 8/2014 | Kanno | |

FOREIGN PATENT DOCUMENTS

| JP | 2012-209828 | 10/2012 |
|---|---|---|
| WO | WO 2013/035584 | 3/2013 |

OTHER PUBLICATIONS

International Preliminary Report on Patentability dated Jul. 21, 2016 for Appln. No. PCT/JP2015/050022.
(Continued)

*Primary Examiner* — Benny Lee
*Assistant Examiner* — Hafizur Rahman
(74) *Attorney, Agent, or Firm* — Pillsbury Winthrop Shaw Pittman, LLP

(57) ABSTRACT

A control device according to the present invention is provided with (A) a variable capacitance device including a variable capacitance element, and (B) a control unit configured to apply a control voltage with a first polarity to the variable capacitance device during a third period including a first period to perform communication using the variable capacitance device and a second period not to perform communication before the first period, and configured to apply a control voltage with a second polarity opposite to the first polarity to the variable capacitance device during a sixth period including a fourth period to perform communication and a fifth period not to perform communication before the fourth period.

9 Claims, 14 Drawing Sheets

(51) Int. Cl.
*H03H 1/02* (2006.01)
*H01G 7/06* (2006.01)
(52) U.S. Cl.
CPC ................. *H01G 7/06* (2013.01); *H03H 1/02* (2013.01); *H03H 2210/025* (2013.01); *H03H 2210/033* (2013.01); *H03H 2210/043* (2013.01)
(58) Field of Classification Search
CPC ....... H03H 2210/033; H03H 2210/043; H01G 7/06
USPC ........................................................ 333/172
See application file for complete search history.

(56) References Cited

OTHER PUBLICATIONS

International Search Report dated Feb. 3, 2015 for Appln No. PCT/JP2015/050022.

\* cited by examiner

| No. | variable capacitance device (C) | DC-cut capacitor ($C_{DC1}=C_{DC2}$) | entire system (combination of C,$C_{DC1}$,$C_{DC2}$) | variability of entire system |
|---|---|---|---|---|
|  | 100pF | no capacitance | 100pF | 33.0% |
| 1 | 100pF | 100pF | 33.3pF | 14.1% |
| 2 | 100pF | 1nF | 83.3pF | 29.1% |
| 3 | 100pF | 10nF | 98.0pF | 32.6% |
| 4 | 100pF | 100nF | 99.8pF | 33.0% |

DUM: dummy
COM: communication

CONTROL DEVICE FOR VARIABLE CAPACITANCE DEVICE AND COMMUNICATION DEVICE INCLUDING SAID CONTROL DEVICE

CROSS-REFERENCE TO RELATED APPLICATIONS

This application is a continuation of International Patent Application No. PCT/JP2015/050022, filed Jan. 5, 2015, which in turn claims the benefit and priority of Japanese Patent Application No. 2014-001173, filed Jan. 7, 2014, the entire contents of all applications are incorporated herein by reference in their entireties.

TECHNICAL FIELD

The present invention relates to a technique for controlling a variable capacitance device.

BACKGROUND

There has been known a technique for suppressing the effect of hysteresis properties (application history properties of control voltage) and capacitance aging properties (such as change in capacitance over time, change in capacitance due to continuous application of control voltage, or failure of the capacitance to recover while the control voltage is not applied) of a variable capacitance capacitor including a ferroelectric material, as disclosed in Japanese Patent Application Publication No. 2012-209828. The invention of this publication employs a variable capacitance capacitor for adjusting the resonance frequency in a communication device performing noncontact communication. This technique includes applying a bias voltage alternately to the opposite terminals of a variable capacitance capacitor during a length (e.g., 2.2 seconds) of communication, instead of applying a bias voltage to only one of the opposite terminals during a length of communication. The length of applying a bias voltage is designed to be substantially equal for the opposite terminals. The above publication also discloses that one of the terminals receives a bias voltage during a length of communication, while the other terminal receives a bias voltage during the same length as a dummy voltage not used for communication.

However, the above publication does not include sufficient discussion on the hysteresis properties and the capacitance aging properties of a variable capacitance device including a ferroelectric material. In particular, it does not take account of the necessity of applying a bias voltage based on the length of communication. Further, it also does not take account of the asymmetry of response to application of a bias voltage depending on the configuration of the variable capacitance device.

RELEVANT REFERENCES

Patent Literature

Patent Literature 1: Japanese Patent Application Publication No. 2012-209828

SUMMARY

Accordingly, in accordance with one aspect, an object of the present invention is to provide a novel technique for proper application control of a bias voltage in accordance with the properties of a variable capacitance device.

A control device according to the present invention comprises: (A) a variable capacitance device including a variable capacitance element; and (B) a control unit configured to apply a control voltage with a first polarity to the variable capacitance device during a third period including a first period to perform communication using the variable capacitance device and a second period not to perform communication before the first period, and configured to apply a control voltage with a second polarity opposite to the first polarity to the variable capacitance device during a sixth period including a fourth period to perform communication and a fifth period not to perform communication before the fourth period.

Thus, capacitance aging, etc. can be prevented even when a control voltage is applied for a period longer than a period during which communication is performed. Also, less power may be consumed for control if the control voltage is not switched frequently.

Further, the third period described above may further include one or more seventh periods to perform the communication, and the sixth period described above may further include one or more eighth periods to perform the communication. Thus, the control voltage may be applied for a longer period.

Further, the length of the third period may be equal to the length of the sixth period. Such a condition may be employed if the same control voltage is applied.

Further, the start time of the sixth period may be equal to or later than the end time of the third period. That is, the third period and the sixth period may not overlap with each other.

Further, a period equal to or longer than a first time constant corresponding to the first polarity may be provided from a start time of the third period and may be followed by the first period, and a period equal to or longer than a second time constant corresponding to the second polarity may be provided from a start time of the sixth period and may be followed by the fourth period. When there is asymmetry in the response speed of the variable capacitance device, the application of the control voltage may be thus controlled to appropriately perform communication.

Further, the variable capacitance device may include first and second terminals for applying control voltages to the variable capacitance device. The control voltage applied with the first polarity may be applied to the first terminal and have a particular voltage polarity, and the control voltage applied with the second polarity may be applied to the second terminal and have the particular voltage polarity. Such application control of the control voltage may be facilitated by using positive voltage, for example.

Further, the variable capacitance device may include two terminals for applying control voltages to the variable capacitance device. The control voltage applied with the first polarity may be applied to one of the terminals and have a first voltage polarity, and the control voltage applied with the second polarity may be applied to the one of the terminals and have a second voltage polarity opposite to the first voltage polarity. Thus, communication can be performed by using only one of the terminals that is high in response speed, so as to shorten the period during which communication is not possible.

Further, the variable capacitance device may include an even number of variable capacitance elements.

Such a control device may be used in a communication device in which a variable capacitance device controls resonance frequency.

In accordance with one aspect, application control of a bias voltage can be performed properly in accordance with the properties of a variable capacitance device.

DESCRIPTION OF EXAMPLE EMBODIMENTS

As to a Variable Capacitance Device in an Embodiment

Figure 1:
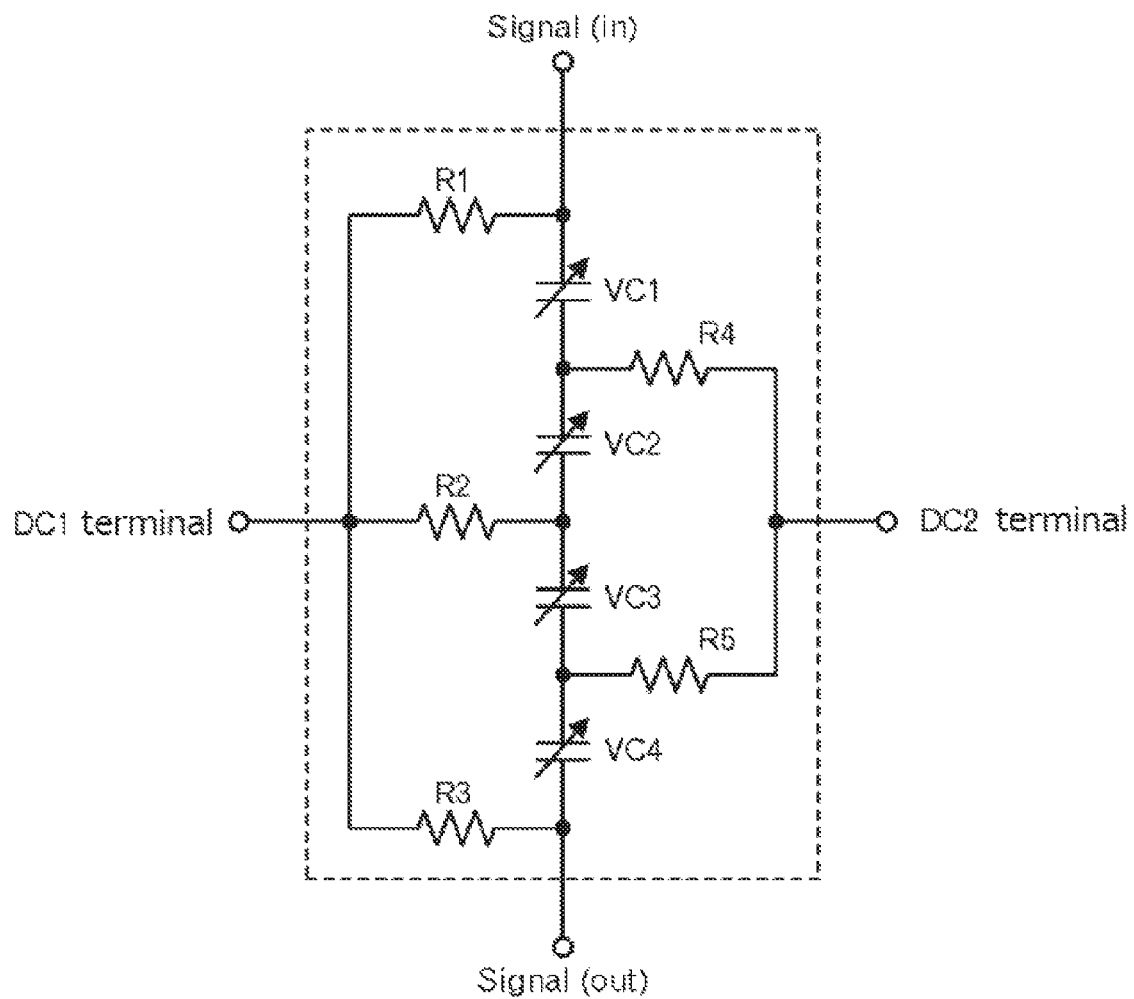
FIG. 1 is a circuit diagram of a variable capacitance device according to an embodiment.

For this embodiment, control of a bias voltage applied to a variable capacitance device as shown in FIG. 1 will be described.

The variable capacitance device according to the embodiment may include variable capacitance elements VC1 to VC4 in a signal line from an input terminal (in) to an output terminal (out). The input side of the variable capacitance element VC1 may be connected to DC1 terminal for applying a bias voltage via a resistance R1, and the output side of the variable capacitance element VC1 may be connected to DC2 terminal for applying a bias voltage via a resistance R4. Likewise, the input side of the variable capacitance element VC2 may be connected to DC2 terminal via the resistance R4, and the output side of the variable capacitance element VC2 may be connected to DC1 terminal via the resistance R2. The input side of the variable capacitance element VC3 may be connected to DC1 terminal via the resistance R2, and the output side of the variable capacitance element VC3 may be connected to DC2 terminal via the resistance R5. Further, the input side of the variable capacitance element VC4 may be connected to DC2 terminal via the resistance R5, and the output side of the variable capacitance element VC4 may be connected to DC1 terminal via the resistance R3.

Thus, according to new findings obtained by the Inventors, the capacitance of each of the variable capacitance elements may be controlled by bias voltages applied from DC1 terminal and DC2 terminal to the input side and output side of the variable capacitance element. This embodiment may include an even number of variable capacitance elements.

Figure 2:
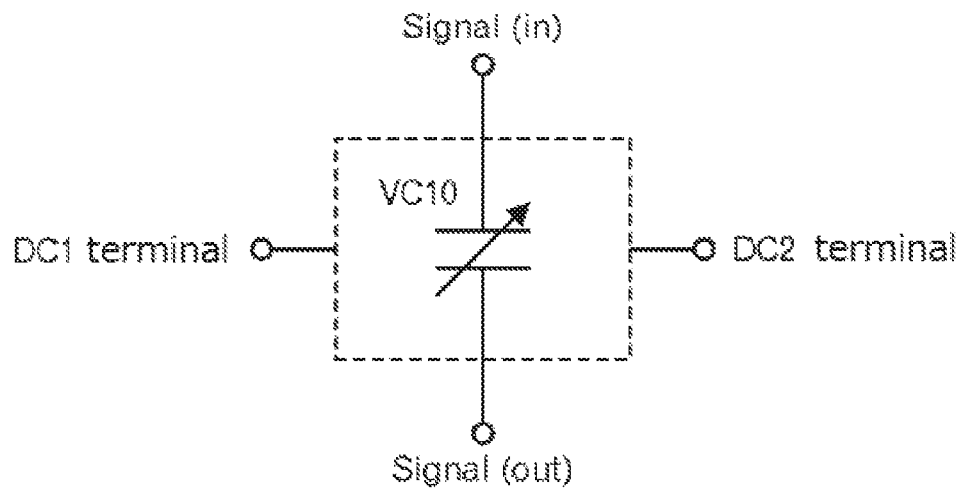
FIG. 2 schematically shows a variable capacitance device according to an embodiment.

The variable capacitance elements VC1 to VC4 may be treated as one variable capacitance element having a combined capacitance of these variable capacitance elements. Therefore, it is supposed in the following description that the variable capacitance device includes one variable capacitance element VC10, as shown in FIG. 2.

Figure 3:
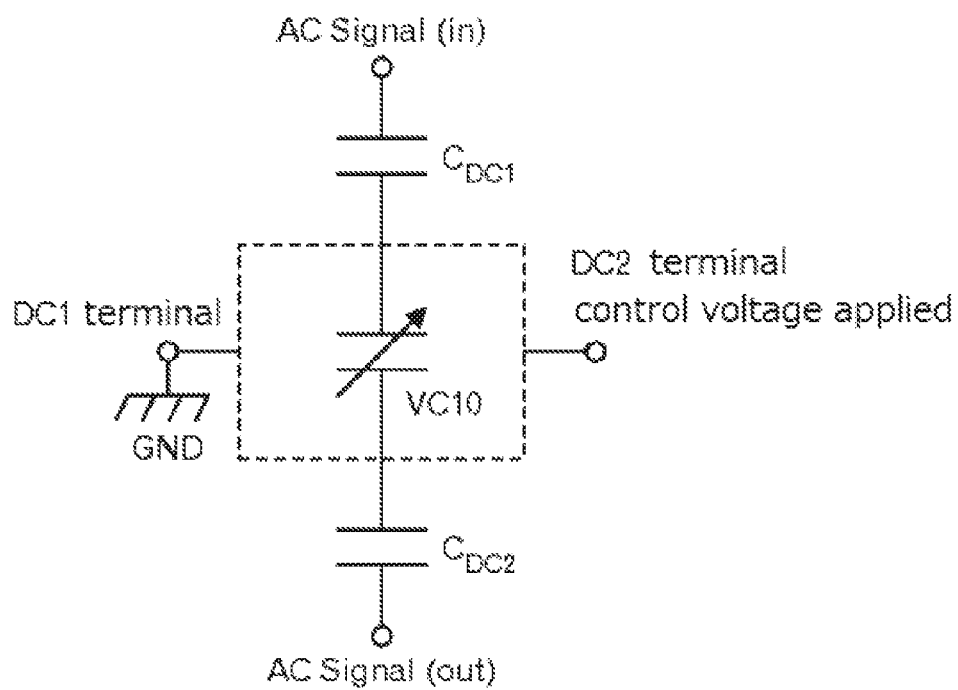
FIG. 3 shows a first aspect (forward connection) of bias voltage application.

The variable capacitance device as shown in FIG. 1 may have the input terminal thereof connected to DC-cut capacitor $C_{DC1}$, and have the output terminal thereof connected to DC-cut capacitor $C_{DC2}$, as shown in FIG. 3.

As shown in FIG. 3, it is typical that DC2 terminal may receive a control voltage (bias voltage) for adjusting the capacitance implemented by the variable capacitance capacitor VC10, and DC1 terminal is grounded. This configuration may be referred to as forward connection.

However, as described in the related art, repetition of application of such a control voltage may make it difficult to accurately control the capacitance due to the hysteresis properties and the capacitance aging properties. To overcome this problem, bias voltage control may also be performed so as to apply a control voltage to DC1 terminal and ground DC2 terminal. This configuration may be referred to as reverse connection.

Figures 4, 5:
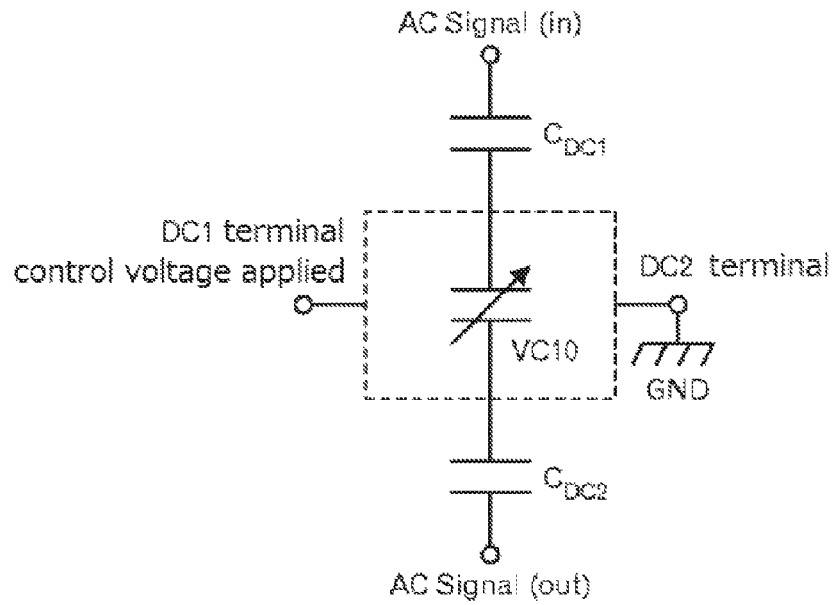
FIG. 4 shows a second aspect (reverse connection) of bias voltage application.
FIG. 5 illustrates capacitance setting of a DC-cut capacitor.
Figure 6:
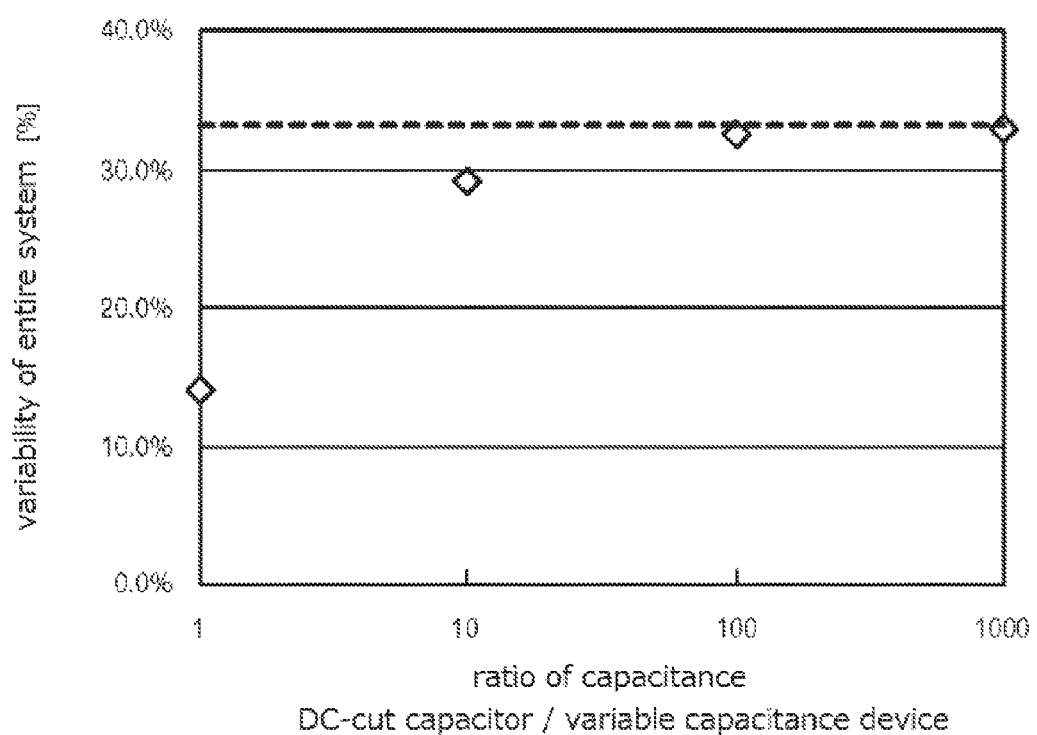
FIG. 6 illustrates capacitance setting of a DC-cut capacitor.

The capacitances of DC-cut capacitors $C_{DC1}$ and $C_{DC2}$ may be designed so as to maximize the variability of the entire system. For example, when the combined capacitance C of the variable capacitance device not receiving a control voltage is 100 pF and the DC-cut capacitor has "no capacitance" as shown in FIG. 5, the capacitance of the entire system (the combined capacitance of C, $C_{DC1}$, and $C_{DC2}$) may be 100 pF and the variability of the entire system may be 33.0%. In contrast, when the capacitance of the DC-cut capacitor is changed from 100 pF to 100 nF, the capacitance of the entire system may gradually increase, and the variability of the entire system may also increase accordingly. When the capacitance of the DC-cut capacitor is about 100 nF, the achieved variability may be the same as in the case where no DC-cut capacitor can be provided. More specifically, as shown in FIG. 6, when the ratio of the capacitance of the DC-cut capacitor to the capacitance of the variable capacitance device is about 1000, the variability of the entire system is sufficiently large. Therefore, the capacitance of the DC-cut capacitor may be set to achieve such a relationship.

When the variable capacitance device is arranged such that an even number of variable capacitance elements are connected in series as shown in FIG. 1, the response speed of change in capacitance may be reduced in the case of reverse connection (FIG. 4), which does not occur in the case of forward connection (FIG. 3).

Figure 7:
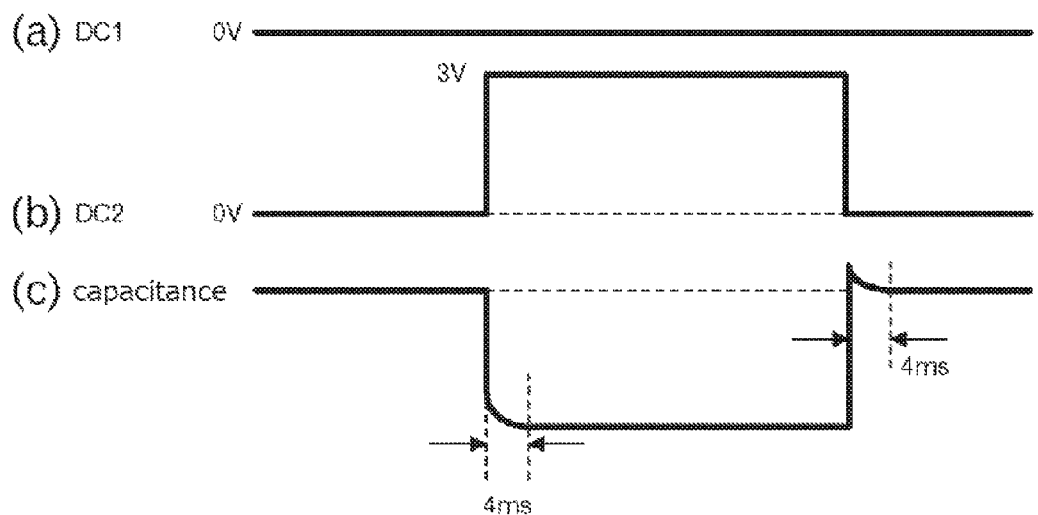
FIG. 7 illustrates change of capacitance over time in a forward connection.

For example, when the capacitance of the DC-cut capacitor is 10 nF, the capacitance of the variable capacitance element VC1 is 100 pF, and the resistance R4 is 1 MΩ, the response time (time constant) for the forward connection may be about 4 ms. That is, as shown in FIG. 7, when DC1 terminal receives 0 V and DC2 terminal receives 3 V, the capacitance may change to a target value in about 4 ms and also return to the original value in about 4 ms. Such response speed is acceptable.

Figure 8:
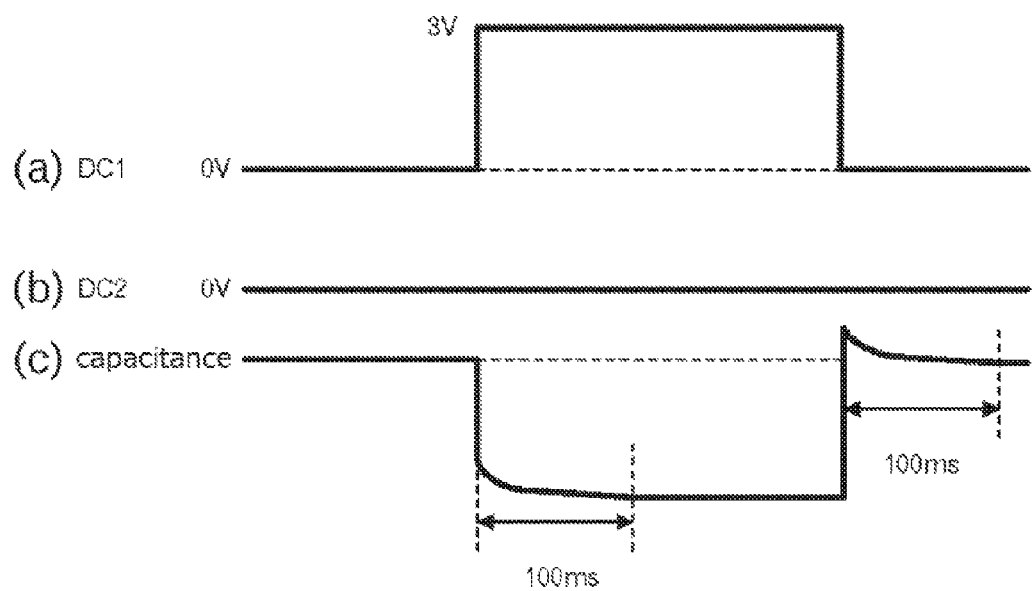
FIG. 8 illustrates change of capacitance over time in a reverse connection.

In contrast, the response time may be about 100 ms for the reverse connection. As shown in FIG. 8, when DC2 terminal receives 0 V and DC1 terminal receives 3 V, the capacitance may change to a target value in about 100 ms and also return to the original value in about 100 ms. With such a response time, it may require longer time to achieve a desired effect by the variable capacitance device.

Figure 9:
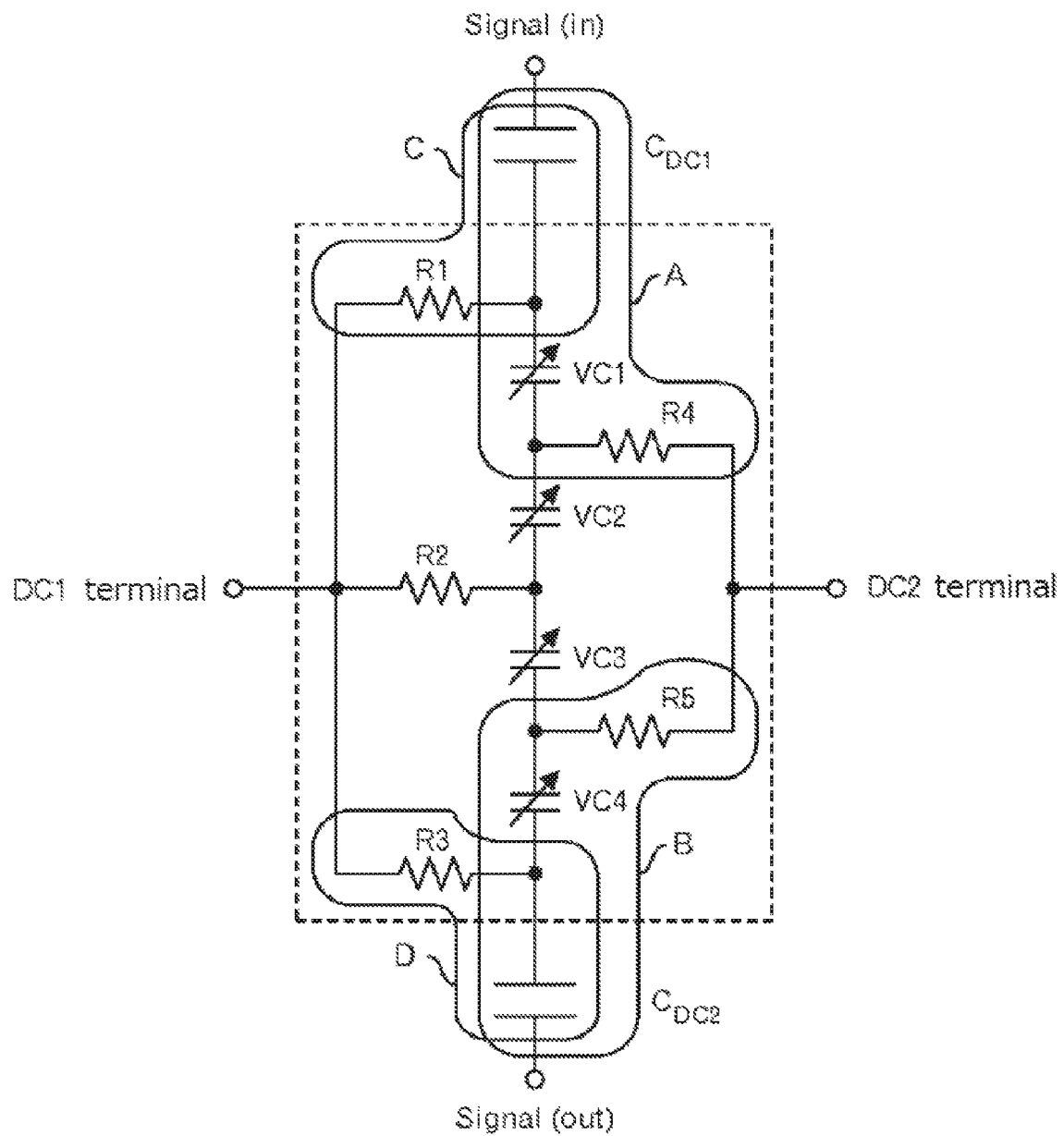
FIG. 9 illustrates asymmetry of response speed.

When there are an even number of variable capacitance elements in the forward connection, DC1 terminal may be grounded and DC2 terminal may receive a bias voltage. Thus, as shown in region A of FIG. 9, the variable capacitance element VC1 and the DC-cut capacitor $C_{DC1}$ may be charged via the resistance R4. Since the variable capacitance element VC1 and the DC-cut capacitor $C_{DC1}$ may be connected in series, and the capacitance of the variable capacitance element VC1 may be significantly smaller than the capacitance of the DC-cut capacitor $C_{DC1}$, charging may be complete in a shorter time. Likewise, as shown in region B of FIG. 9, the variable capacitance element VC4 and the DC-cut capacitor $C_{DC2}$ may be charged with the bias voltage applied to DC2 terminal via the resistance R5. Since the variable capacitance element VC4 and the DC-cut capacitor $C_{DC2}$ may be connected in series, and the capacitance of the variable capacitance element VC4 may be significantly smaller than the capacitance of the DC-cut capacitor $C_{DC2}$, charging may be complete in a shorter time. Therefore, the change of capacitance may be rapid as shown in FIG. 7.

In contrast, when there are an even number of variable capacitance elements in the reverse connection, DC2 terminal may be grounded and DC1 terminal may receive a bias voltage. Thus, as shown in region C of FIG. 9, the DC-cut capacitor $C_{DC1}$ may be charged via the resistance R1. Since the capacitance of the DC-cut capacitor $C_{DC1}$ may be significantly larger than the capacitance of the variable capacitance element VC1, charging may require a longer time. Likewise, as shown in region D of FIG. 9, the DC-cut capacitor $C_{DC2}$ may be charged with the bias voltage applied to DC1 terminal via the resistance R3. Since the capacitance of the DC-cut capacitor $C_{DC2}$ may be significantly larger than the capacitance of the variable capacitance element VC4, charging may require a longer time. Therefore, the change of capacitance may be slow as shown in FIG. 8.

Thus, when there are an even number of variable capacitance elements, the response speed of capacitance may be asymmetric between the forward connection and the reverse connection.

Figure 10:
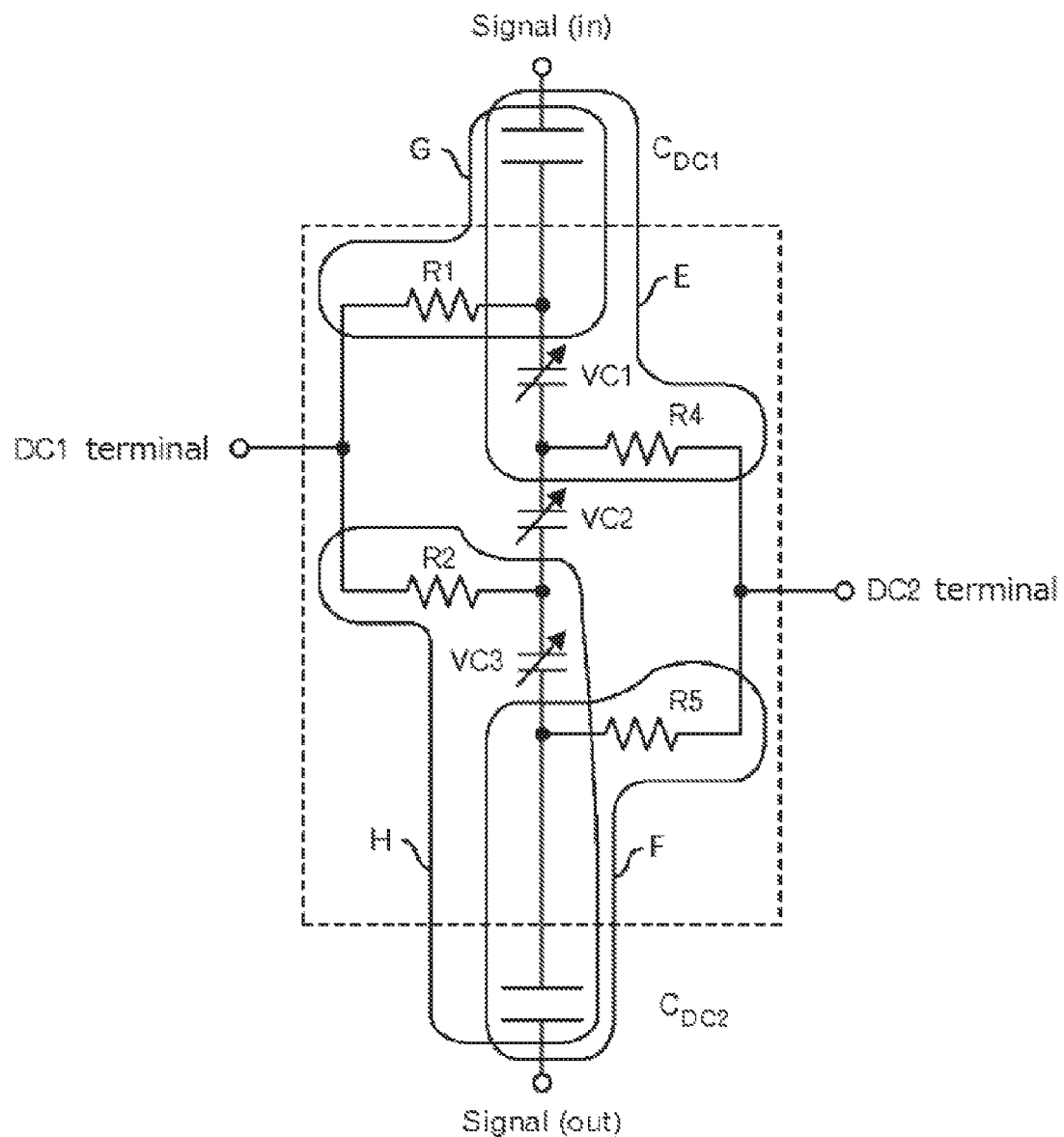
FIG. 10 illustrates asymmetry of response speed.

For example, when there are three (an odd number) variable capacitance elements in the forward connection, DC1 terminal may be grounded and DC2 terminal may receive a bias voltage in FIG. 10. Thus, as shown in region E of FIG. 10, the variable capacitance element VC1 and the DC-cut capacitor $C_{DC1}$ may be charged via the resistance R4. Since the variable capacitance element VC1 and the DC-cut capacitor $C_{DC1}$ may be connected in series, and the capacitance of the variable capacitance element VC1 may be significantly smaller than the capacitance of the DC-cut capacitor $C_{DC1}$, charging may be complete in a shorter time. However, as shown in region F of FIG. 10, the DC-cut capacitor $C_{DC2}$ may be charged with the bias voltage applied to DC2 terminal via the resistance R5. Since the capacitance of the DC-cut capacitor $C_{DC2}$ may be significantly larger than the capacitance of the variable capacitance element, charging may require a longer time. Therefore, the entire response speed may be lower.

In contrast, when there are an odd number of variable capacitance elements in the reverse connection, DC2 terminal may be grounded and DC1 terminal may receive a bias voltage in FIG. 10. Thus, as shown in region G of FIG. 10, the DC-cut capacitor $C_{DC1}$ may be charged via the resistance R1. Since the capacitance of the DC-cut capacitor $C_{DC1}$ may be significantly larger than the capacitance of the variable capacitance element VC1, charging may require a longer time. In contrast, as shown in region H of FIG. 10, the variable capacitance element VC3 and the DC-cut capacitor $C_{DC2}$ may be charged with the bias voltage applied to DC1 terminal via the resistance R2. Since the DC-cut capacitor $C_{DC2}$ and the variable capacitance element VC3 may be connected in series, and the capacitance of the variable capacitance element VC3 may be significantly smaller than the capacitance of the DC-cut capacitor $C_{DC2}$, charging may be complete in a shorter time. Therefore, the entire response speed may be lower.

Thus, when there are an odd number of variable capacitance elements, the asymmetry of the response speed may not occur. The related art does not take account of the case where such asymmetry of the response speed occurs.

Further, the related art discloses applying a control voltage in units of a length of communication (e.g., 2.2 seconds in the related art). However, switching of application of control voltage based on a length of communication may lead to increase of power consumed by the control circuit.

Figure 11:
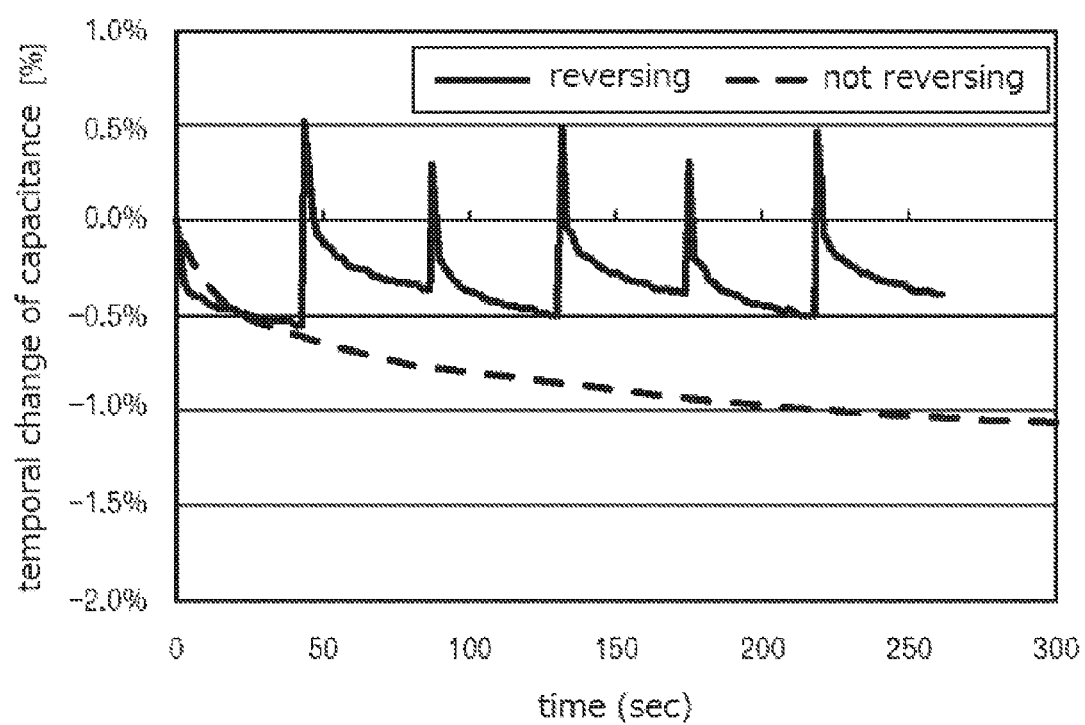
FIG. 11 illustrates the effect of switching between the forward connection and the reverse connection.

According to the Inventor of the present invention, when a control voltage of 3V is continuously applied in only the forward connection or the reverse connection, the capacitance may be reduced gradually over time and become 1% lower after about 250 seconds, as shown with a dotted line in FIG. 11. In contrast, switching between the forward connection and the reverse connection each 44 seconds may produce change by only about 0.5%.

The rate of change may vary depending on the materials of dielectric films used in forming the variable capacitance elements, which may include an oxide having a perovskite structure such as a strontium titanate ($SrO_3$) film acting as a paraelectric and a barium strontium titanate (($Ba, Sr)TiO_3$) film acting as a ferroelectric.

Figure 12:
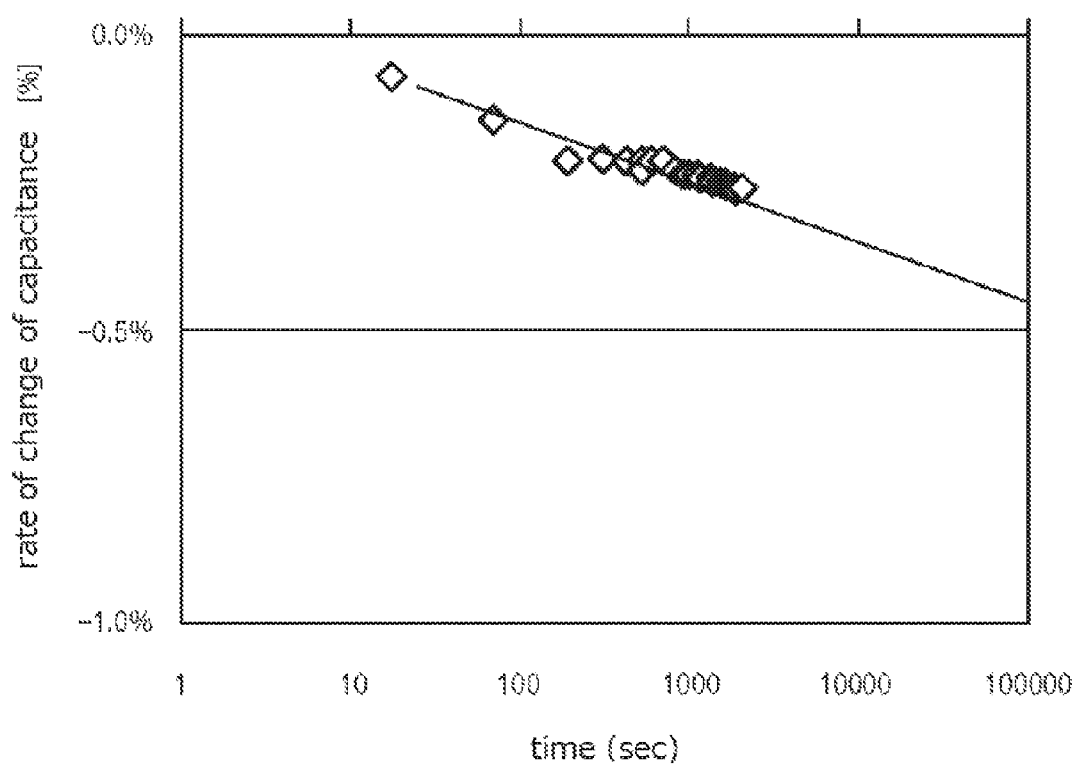
FIG. 12 illustrates the relationship between the application time of a control voltage and the change in capacitance.

The rate of change of capacitance as shown in FIG. 12 may be obtained with variable capacitance device formed of $SrTiO_3$ films and varied application time of a control voltage of 5V. Thus, although longer application time may increase the absolute value of the rate of change of capacitance, it is expected that the rate of change for this material will be 0.5% or less after about 100,000 seconds.

Thus, even when a control voltage is applied for a period longer than a length of communication, the application time in the forward connection (referred to as $T_{C1}$) may be equal to the application time in the reverse connection (referred to as $T_{C2}$) so as to avoid the hysteresis properties and the capacitance aging properties.

Embodiment 1

Figure 13A:
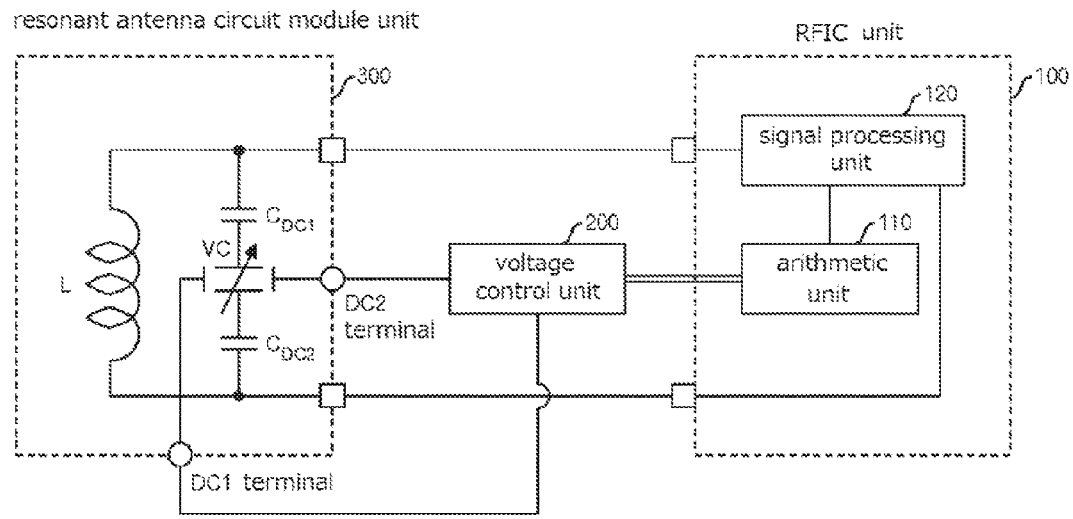
FIG. 13A is a function block diagram of a communication device according to an embodiment.

FIG. 13A shows an example of configuration of a communication device according to this embodiment. This communication device may include a radio frequency integrated circuit (RFIC) unit 100, a voltage control unit 200, and a resonant antenna circuit module unit 300.

The resonant antenna circuit module unit 300 may include an inductor L and a series circuit connected in parallel with the inductor L, the series circuit including a DC-cut capacitor $C_{DC1}$, a variable capacitance device VC, and a DC-cut capacitor $C_{DC2}$, thereby forming a resonant antenna. The resonance frequency of the resonant antenna circuit module unit 300 may be determined by the capacitances of the inductor L and the above series connection circuit.

The RFIC unit 100 may include a signal processing unit 120 and an arithmetic unit 110. The signal processing unit 120 may perform processes for communication such as demodulation of a high frequency signal RF received by the resonant antenna circuit module unit 300. The arithmetic unit 110 may control the operation timing of the signal processing unit 120 and provide instructions at predetermined timings to the voltage control unit 200 for a first mode or a second mode. In the first mode, a bias voltage may be applied to DC1 terminal and DC2 terminal may be grounded (i.e., reverse connection), while in the second mode, a bias voltage may be applied to DC2 terminal and DC1 terminal may be grounded (i.e., forward connection). The arithmetic unit 110 may also provide instructions to the voltage control unit 200 for a bias voltage to be applied to the variable capacitance device VC.

Figure 13B:
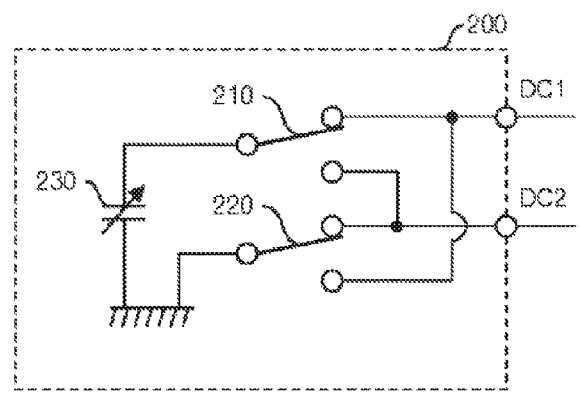
FIG. 13B shows an example of a voltage control unit.

As shown in FIG. 13B, the voltage control unit 200 may include a power source unit 230 for outputting a bias voltage in accordance with an instruction from the arithmetic unit 110, a switch 210 for applying the output voltage from the power source unit 230 to one or both of DC1 terminal and DC2 terminal in accordance with an instruction from the arithmetic unit 110, and a switch 220 for grounding one or both of DC1 terminal and DC2 terminal in accordance with an instruction from the arithmetic unit 110.

When instructed for the first mode by the arithmetic unit 110, the voltage control unit 200 may apply a designated bias voltage to the DC1 terminal and ground DC2 terminal, and when instructed for the second mode, the voltage control unit 200 may apply a bias voltage to DC2 terminal and ground DC1 terminal.

Figure 14:
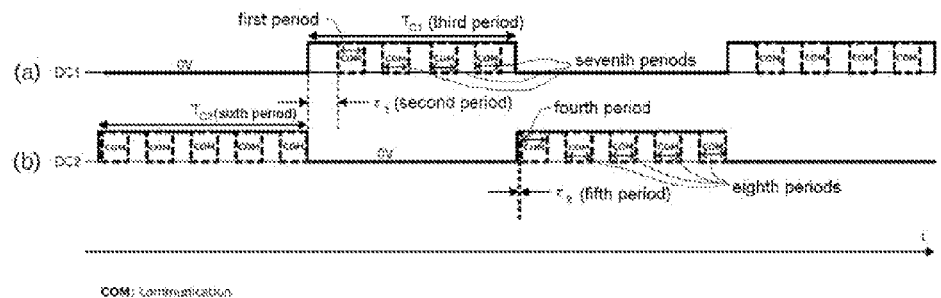
FIG. 14 shows temporal change of bias voltages applied to DC1 terminal and DC2 terminal in the first embodiment.

The control scheme of the bias voltage according to Embodiment 1 will now be described with reference to FIG. 14. In FIG. 14, (a) shows temporal change of bias voltages applied to DC1 terminal, and (b) shows temporal change of bias voltages applied to DC2 terminal.

In Embodiment 1, a repeated cycle may include the second mode continued for $T_{C2}$ and then the first mode continued for $T_{C1}$. In this embodiment, $T_{C1}=T_{C2}$. This may prevent capacitance aging. In this embodiment, $T_{C1}$ and $T_{C2}$, which are equal and depend on the material used in the variable capacitance elements, may be about 1 to 100,000 seconds. Since long time duration is possible, less power is consumed as compared to the case where the device is switched between the two modes rapidly. The arithmetic unit 110 may provide instructions to the voltage control unit 200 for designating $T_{C1}$ and $T_{C2}$, and the voltage control unit 200 may switch the bias voltage.

One feature of Embodiment 1 may be that a plurality of communications may be performed within $T_{C1}$ and $T_{C2}$.

Further, when a bias voltage is applied to DC1 terminal, the first communication may be performed a predetermined time $T_1$ after the application of the bias voltage is started. The predetermined time $T_1$ may be equal to or greater than a time constant for response in the case where the bias voltage is applied to DC1 terminal (100 ms in the above example). When a bias voltage is applied to DC2 terminal, the first communication may be performed a predetermined time $T_2$ after the application of the bias voltage is started. The predetermined time $T_2$ may be equal to or greater than a time constant for response in the case where the bias voltage is applied to DC2 terminal (4 ms in the above example).

The arithmetic unit 110 may cause the signal processing unit 120 to perform communication a predetermined time $T_1$ after it provides an instruction to the voltage control unit 200 for applying a bias voltage to DC1 terminal. Likewise, the arithmetic unit 110 may cause the signal processing unit 120 to perform communication a predetermined time $T_2$ after it provides an instruction to the voltage control unit 200 for applying a bias voltage to DC2 terminal.

In FIG. 14, the periods $T_{C1}$ and $T_{C2}$ do not overlap with each other. In another example, the periods $T_{C1}$ and $T_{C2}$ may partially overlap with each other. In this case, the overlapping portions may not contribute to cancellation of capacitance aging, etc., and therefore, non-overlapping portions may have the same length. In FIG. 14, there is no interval between the first mode and the second mode. In another example, there may be intervals between the first mode and the second mode.

Such an arrangement may enable preventing capacitance aging, etc., reducing the power consumed by switching between modes, and preventing the effect of asymmetry of response time on communication.

The number of communications within the period $T_{C1}$ and the number of communications within the period $T_{C2}$ may be set desirably. To maximize the length of the periods during which communication is possible, it may be preferable that as shown in FIG. 14, the first mode should start immediately after the last communication in the second mode is complete because of the low response speed. The transition from the first mode to the second mode may not be as quick as shown in FIG. 14 because of relatively high response speed.

The relationship $T_{C1}=T_{C2}$ may be held for each combination of the first mode and the second mode, and different combinations of the first mode and the second mode may have different values for the relationship $T_{C1}=T_{C2}$.

The bias voltage may be set based on the capacitance to be achieved by the variable capacitance device.

The duration of a communication may be several tens to several hundreds of milliseconds.

Embodiment 2

It has been described that in Embodiment 1, a plurality of communications may be performed in the first mode, and a plurality of communications may be performed in the second mode. The number of communications may be determined based on the frequency or the period of the communications performed by the communication device.

Figure 15:
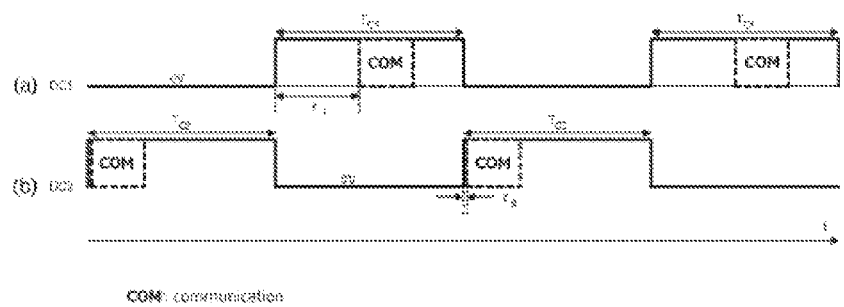
FIG. 15 shows temporal change of bias voltages applied to DC1 terminal and DC2 terminal in the second embodiment.

For example, as shown in FIG. 15, it may be possible that one communication is performed during $T_{C1}$ and one communication is performed during $T_{C2}$, while maintaining the relationship $T_{C1}=T_{C2}$.

In other respects, this embodiment may be configured in the same way as Embodiment 1. In particular, when a bias voltage is applied to DC1 terminal, the first communication may be performed a predetermined time $T_1$ (i.e., $T_1$ in FIG. 15) after the application of the bias voltage is started. The predetermined time $T_1$ may be equal to or greater than a time constant for response in the case where the bias voltage is applied to DC1 terminal (100 ms in the above example). When a bias voltage is applied to DC2 terminal, the first communication may be performed a predetermined time $T_2$ (i.e., $\tau_2$ in FIG. 15) after the application of the bias voltage is started. The predetermined time $T_2$ may be equal to or greater than a time constant for response in the case where the bias voltage is applied to DC2 terminal (4 ms in the above example).

Embodiment 3

It has been described that in Embodiments 1 and 2, the time $T_{C1}$ during which a bias voltage is applied to DC1 terminal may be equal to the time $T_{C2}$ during which a bias voltage is applied to DC2 terminal such that capacitance aging, etc. is prevented. However, the same effect may be produced by applying a bias voltage to only one of the terminals.

In this embodiment, DC2 terminal is selected because the response speed is higher when a bias voltage is applied to DC2 terminal, and the variable capacitance device may be switched between the second mode in which a positive bias voltage may be applied to DC2 terminal and the third mode in which a negative bias voltage may be applied to DC2 terminal. The period $T_{C2}$ of the second mode may be equal to the period $T_{C3}$ of the third mode.

Figure 16:
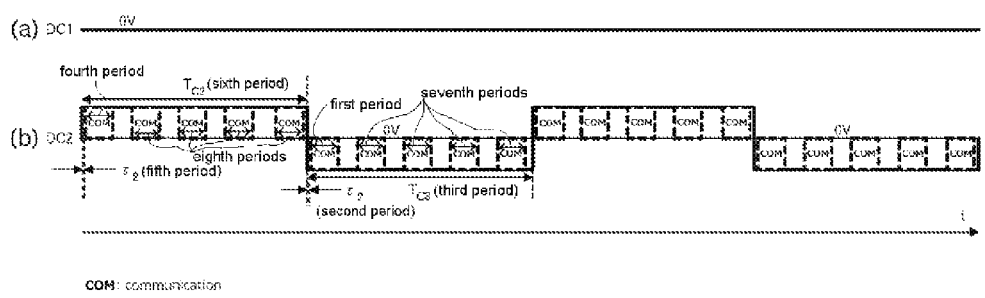
FIG. 16 show temporal change of bias voltages applied to DC1 terminal and DC2 terminal in the third embodiment.

This example may be illustrated in FIG. 16. As shown in (a) of FIG. 16, DC1 terminal may receive no bias voltage. In contrast, as shown in (b) of FIG. 16, DC2 terminal may receive a positive bias voltage during the period $T_{C2}$ of the second mode and receive a negative bias voltage during the period $T_{C3}$ of the third mode. A plurality of communications may be performed during each of the period $T_{C2}$ and the period $T_{C3}$.

The first communication may be performed a predetermined time $T_2$ after the start of the period $T_{C2}$, and the first communication may be performed the predetermined time $T_2$ after the start of the period $T_{C3}$. Since DC2 terminal is used, the time until the first communication may be the predetermined time $T_2$ in both the second mode and the third mode.

In other respects, this embodiment is the same as Embodiment 1. For example, the period $T_{C2}$ and the period $T_{C3}$ may partially overlap with each other, and there may be a period without bias voltage application between the period $T_{C2}$ and the period $T_{C3}$.

The arithmetic unit 110 may cause the signal processing unit 120 to perform communication a predetermined time $T_2$ after it provides an instruction to the voltage control unit 200 for applying a positive bias voltage to DC2 terminal. Likewise, the arithmetic unit 110 may cause the signal processing unit 120 to perform communication a predetermined time $T_2$ after it provides an instruction to the voltage control unit 200 for applying a negative bias voltage to DC2 terminal.

Thus, in the bias voltage control on the variable capacitance device VC, the polarity may be reversed by applying bias voltages having different voltage polarities to one of the two terminals as in this embodiment, not only by applying bias voltages having the same voltage polarity to each of the two terminals.

Thus, no bias voltage may be applied to DC1 terminal that is low in response speed, such that the periods during which communication is possible are longer.

Embodiment 4

It has been described that in Embodiment 3, a plurality of communications may be performed in the second mode, and a plurality of communications may be performed in the third mode. The number of communications may be determined based on the frequency or the period of the communications performed by the communication device.

Figure 17:
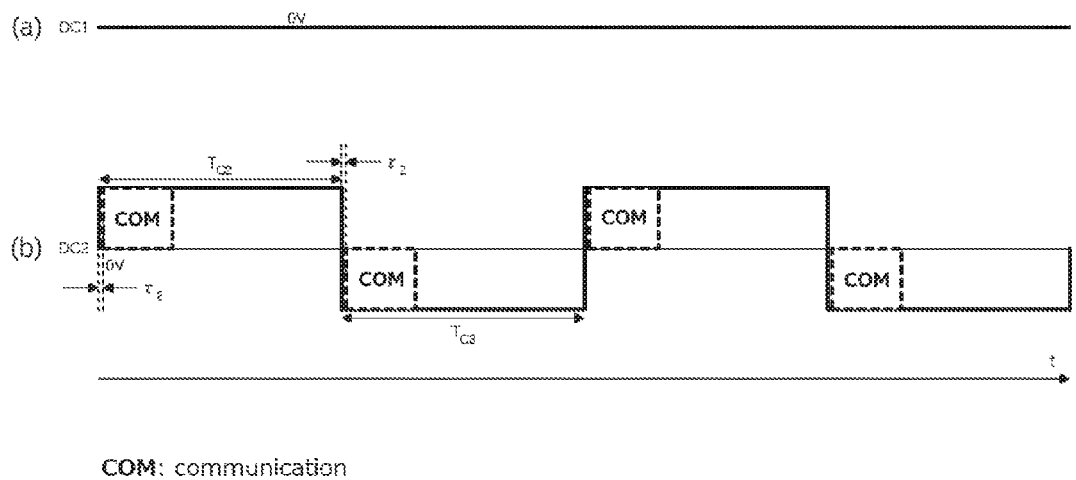
FIG. 17 show temporal change of bias voltages applied to DC1 terminal and DC2 terminal in the fourth embodiment.

For example, as shown in FIG. 17, it may be possible that one communication is performed during $T_{C2}$ and one communication is performed during $T_{C3}$, while maintaining the relationship $T_{C2}=T_{C3}$.

In other respects, this embodiment may be configured in the same way as Embodiment 3. In particular, when a positive or negative bias voltage is applied to DC2 terminal, the first communication may be performed a predetermined time $T_2$ after the application of the bias voltage is started. The predetermined time $T_2$ may be equal to or greater than a time constant for response speed in the case where the bias voltage is applied to DC2 terminal (4 ms in the above example).

Such an arrangement may also enable preventing capacitance aging, etc., and no bias voltage may be applied to DC1 terminal that is low in response speed, such that the periods during which communication is possible are longer.

Embodiment 5

Figure 18:
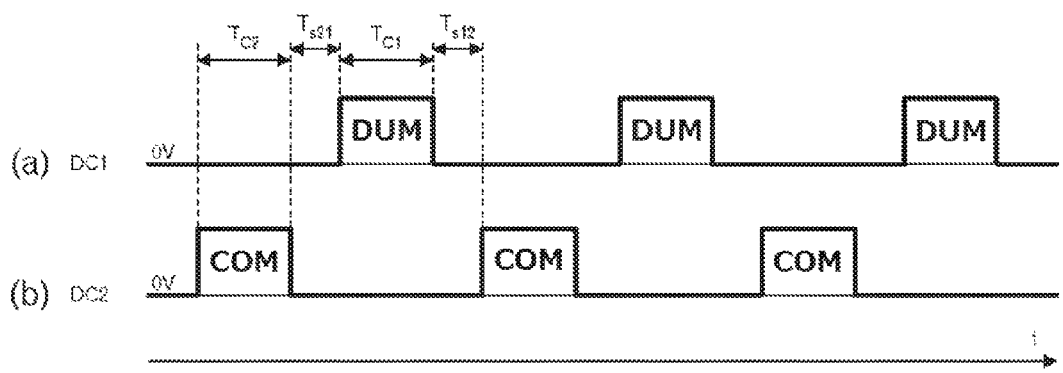
FIG. 18 show temporal change of bias voltages applied to DC1 terminal and DC2 terminal in the fifth embodiment.

FIG. 18 shows an aspect of application control of a bias voltage according to Embodiment 5. Although bias voltages may be applied to DC1 terminal that is low in response speed, no communication may be performed while a bias voltage is applied to DC1 terminal. Communication may be performed while a bias voltage is applied to DC2 terminal. That is, the bias voltage applied to DC1 terminal may be dummy and used only for preventing capacitance aging, etc.

In the period $T_{S21}$ following the period $T_{C2}$ during which a bias voltage may be applied to DC2 terminal, no bias voltage may be applied to DC1 terminal or DC2 terminal. Likewise, in the period $T_{S12}$ following the period $T_{C1}$ during which a bias voltage may be applied to DC1 terminal, no bias voltage may be applied to DC1 terminal or DC2 terminal. Although $T_{C2}=T_{C1}$, $T_{S21}$ may not be equal to $T_{S12}$. $T_{S21}$ may be zero since the response speed is low.

Thus, a bias voltage may be applied only to DC2 terminal, and the time constant for response may be small. In the drawing, the period during which communication is performed is the same as the period during which a bias voltage is applied.

In such an embodiment, the arithmetic unit 110 may perform control so as to synchronize the signal processing unit 120 and the voltage control unit 200.

The idea of this embodiment may be applied to Embodiments 1 and 2.

Embodiment 6

Figure 19:
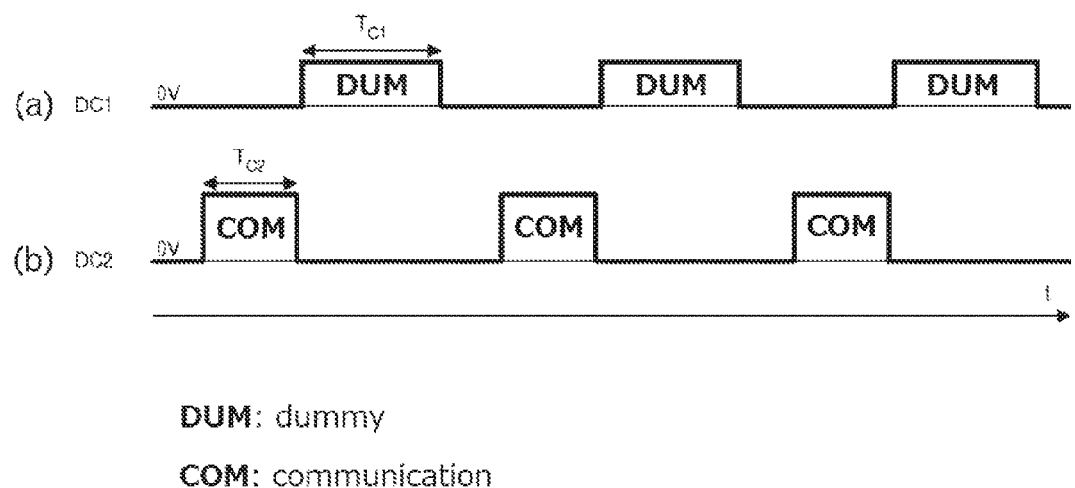
FIG. 19 show temporal change of bias voltages applied to DC1 terminal and DC2 terminal in the sixth embodiment.

In Embodiments 1 to 4, communication may be performed in both forward connection and reverse connection, and thus a bias voltage applied to DC1 terminal may be equal to a bias voltage applied to DC2 terminal. In contrast, in Embodiment 5, no communication may be performed while a bias voltage is applied to DC1 terminal that is low in response speed. Therefore, unequal bias voltages may be applied while performing the application control of a bias voltage so as to prevent capacitance aging, etc. For example, as shown in FIG. 19, a bias voltage $V_1$ lower than a bias voltage $V_2$ applied to DC2 terminal may be applied to DC1 terminal, and $T_{C2}<T_{C1}$, so as to prevent capacitance aging, etc.

Figure 20:
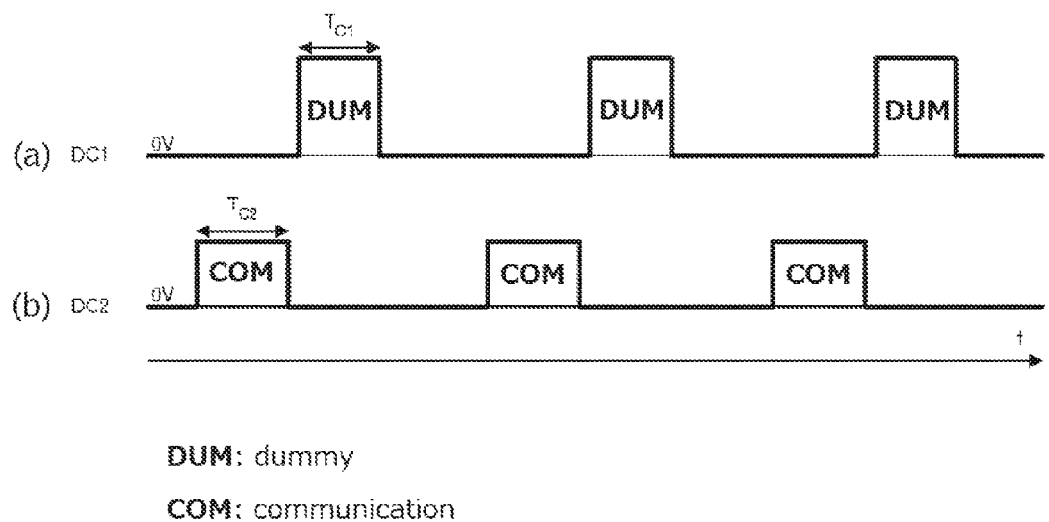
FIG. 20 show temporal change of bias voltages applied to DC1 terminal and DC2 terminal in the sixth embodiment.

Conversely, as shown in FIG. 20, a bias voltage $V_1$ higher than a bias voltage $V_2$ applied to DC2 terminal may be applied to DC1 terminal, and $T_{C2}>T_{C1}$, so as to prevent capacitance aging, etc.

Such modification may also enable preventing the effect of asymmetry of response speed.

Embodiment 7

It has been described that in the preceding embodiments, capacitance aging, etc. is prevented by appropriately setting one period $T_{C2}$ during which a bias voltage is applied to DC2 terminal and one period $T_{C1}$ during which a bias voltage is applied to DC1 terminal. In contrast, it may also be possible that one period $T_{C1}$ may be provided for every n periods $T_{C2}$ so as to prevent capacitance aging, etc.

Figure 21:
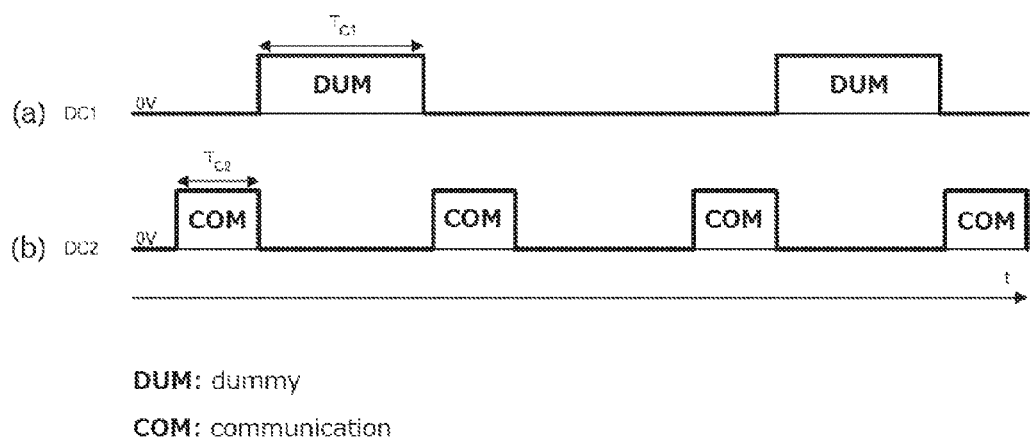
FIG. 21 show temporal change of bias voltages applied to DC1 terminal and DC2 terminal in the seventh embodiment.

In the example shown in FIG. 21, n=2, and thus one period $T_{C1}$ may be provided for every two periods $T_{C2}$. That is, $2 \times T_{C2} = T_{C1}$. The bias voltage applied to DC1 terminal may be equal to the bias voltage applied to DC2 terminal.

The idea of Embodiment 7 may be applied to Embodiments 1 and 2.

The embodiments described above are susceptible to various modifications. For example, the voltage control unit 200, which may be separate from the RFIC unit 100 in the above embodiments, may also be included in the RFIC unit 100. The arithmetic unit 110 in the RFIC unit may be implemented by combination of a processor and a program. The same also applies to the signal processing unit 120.

In the above embodiments, when the variable capacitance device includes an even number of variable capacitance elements, asymmetry of response speed may occur; and when the variable capacitance device includes an odd number of variable capacitance elements, asymmetry of response speed may not occur. However, depending on the structure of the variable capacitance device, the asymmetry of response speed may or may not occur on different conditions. Even when the asymmetry of response speed does not occur, the variable capacitance device may employ the idea of applying a bias voltage for a period longer than the period during which communication is performed so as to reduce the frequency of switching of the bias voltage. That is, this idea is effective in view of reducing the frequency of switching to reduce the power consumed by the control.

LIST OF REFERENCE NUMBERS

100 RFIC unit
200 voltage control unit
300 resonant antenna circuit module unit
120 signal processing unit
110 arithmetic unit

What is claimed is:

1. A control device comprising: a variable capacitance device; and a control unit configured to apply a control voltage with a first polarity to the variable capacitance device during a third period including a first period to perform communication using the variable capacitance device and a second period not to perform communication before the first period, and configured to apply a control voltage with a second polarity opposite to the first polarity to the variable capacitance device during a sixth period including a fourth period to perform communication and a fifth period not to perform communication before the fourth period, wherein the variable capacitance device includes an even number of variable capacitance elements.

2. A control device comprising: a variable capacitance device; and a control unit configured to apply a control voltage with a first polarity to the variable capacitance device during a third period including a first period to perform communication using the variable capacitance device and a second period not to perform communication before the first period, and configured to apply a control voltage with a second polarity opposite to the first polarity to the variable capacitance device during a sixth period including a fourth period to perform communication and a fifth period not to perform communication before the fourth period, wherein the third period further includes one or more seventh periods to perform the communication, and the sixth period further includes one or more eighth periods to perform the communication.

3. The control device of claim 2 wherein a length of the third period is equal to a length of the sixth period.

4. The control device of claim 2 wherein a start time of the sixth period is equal to or later than an end time of the third period.

5. The control device of claim 2 wherein a period equal to or longer than a first time constant corresponding to the first polarity is provided from a start time of the third period and is followed by the first period, and a period equal to or longer than a second time constant corresponding to the second polarity is provided from a start time of the sixth period and is followed by the fourth period.

6. The control device of claim 2 wherein the variable capacitance device includes first and second terminals, and wherein the control voltage applied with the first polarity is applied to the first terminal and has a particular voltage polarity, and the control voltage applied with the second polarity is applied to the second terminal and has the particular voltage polarity.

7. The control device of claim 2 wherein the variable capacitance device includes two terminals for applying control voltages to the variable capacitance device, and wherein the control voltage applied with the first polarity is applied to one of the terminals and has a first voltage polarity, and the control voltage applied with the second polarity is applied to the other one of the two terminals and has a second voltage polarity opposite to the first voltage polarity.

8. The control device of claim 2 wherein the variable capacitance device includes an even number of variable capacitance elements.

9. A communication device comprising the control device of claim 2.

* * * * *